United States Patent [19]

White

[11] Patent Number: 5,258,664
[45] Date of Patent: Nov. 2, 1993

[54] OPERATIONAL AMPLIFIER WITH SELF CONTAINED SAMPLE AND HOLD AND AUTO ZERO

[75] Inventor: Bert White, Irvine, Calif.

[73] Assignee: Silicon Systems, Inc., Tustin, Calif.

[21] Appl. No.: 725,966

[22] Filed: Jul. 5, 1991

[51] Int. Cl.$^5$ .......................... G11C 27/02; H03F 1/02
[52] U.S. Cl. .................................. 307/353; 307/494; 328/151; 330/9
[58] Field of Search ............... 307/353, 491, 494, 572, 307/355; 328/151; 330/9

[56] References Cited

U.S. PATENT DOCUMENTS

| | | | |
|---|---|---|---|
| 4,439,693 | 3/1984 | Lucas et al. | 307/353 |
| 4,565,971 | 1/1986 | Brookshire | 330/9 |
| 4,806,790 | 2/1989 | Sone | 307/353 |
| 4,806,875 | 2/1989 | Schaffer | 330/9 |
| 4,833,345 | 5/1989 | Miller | 307/494 |
| 4,962,325 | 10/1990 | Miller et al. | 307/353 |
| 5,124,663 | 6/1992 | McEntarfer et al. | 330/9 |
| 5,142,238 | 8/1992 | White | 330/9 |

Primary Examiner—William L. Sikes
Assistant Examiner—Toan Tran
Attorney, Agent, or Firm—Hecker & Harriman

[57] ABSTRACT

The switched capacitor amplifier circuit of the present invention employs a single amplifier with a built-in sample and hold and input auto zero. The built-in sample and hold of the present invention provides a continuously valid output in a multi-phase system. The present invention comprises a new auto zero configuration and a new amplifier. The new amplifier is referred to as the AZAMP. The circuit configuration of the AZAMP of the present invention comprises a two stage amplifier with switches added to the circuitry to provide the sample and hold function. By disconnecting the second stage during the hold mode, the output voltage will remain unchanged due to the voltage stored on a capacitor within the AZAMP. Charge cancelling circuitry is coupled to the sample and hold circuitry to cancel the charge injected onto said capacitor when the switch is turned off. The AZAMP of the present invention also has a self-contained auto zero function. The resulting benefits are reduced area consumption and low input equivalent offset.

27 Claims, 3 Drawing Sheets

OPERATIONAL AMPLIFIER WITH SELF CONTAINED SAMPLE AND HOLD AND AUTO ZERO

BACKGROUND OF THE INVENTION

1. Field of the Invention

This invention relates to the field of switched-capacitor, differential amplifiers.

2. Background Art

When implementing operational amplifiers in integrated circuits, ideal characteristics are difficult to achieve. Ideally, when a zero voltage is applied between the inputs of an operational amplifier, the output voltage is zero. In actual amplifiers, however, process variations which result in an imperfect matching of components within the amplifier lead to a positive or negative output voltage when the inputs are forced to zero. The magnitude of the output voltage is directly proportional to the open loop gain of the amplifier and is called output offset voltage.

In order to eliminate the effect of offset voltage, a scheme called "auto zeroing" is utilized. In auto zeroing, a two phased switching scheme is used. In one phase, an input voltage $V_{IN}$ is inputted to one input of an operational amplifier through a capacitor, with the other input being tied to a reference voltage (typically ground). During the second phase, both inputs are tied to ground to compensate for the effect of offset voltage and to automatically "zero" the amplifier. Thus, input voltage signals are only available (valid) during one phase of operation.

It is frequently necessary to design a switched capacitor amplifier circuit whose input is auto zeroed and whose output is continuously valid. In prior art this design requires two amplifier circuits, each with its own set of switches and capacitors.

A typical prior art design of an auto-zero amplifier is illustrated in FIGS. 1A and 1B. FIG. 1A shows a first amplifier which is an auto zeroed structure with gain greater than one and whose output is only available in one phase (AZ* phase). FIG. 1A shows that input voltage $V_{IN}$ 10 is coupled to capacitor C1 by switch 12 during the AZ* phase, while input voltage $V_{zero}$ 11 is coupled to capacitor C1 by switch 12 during the AZ phase. Capacitor C1 is also coupled to the negative input of operational amplifier 21 at node 14. Node 14 is also coupled to capacitor C2 as well as coupled to switch 17. Capacitor C2 is coupled to switch 18. During AZ phase, switch 18 is coupled to output reference voltage OUTREF 19, and during AZ* phase, switch 18 is coupled to the output of amplifier 21. Switch 17 is also coupled to the output of amplifier 21 at node 20 during AZ phase. Switch 17 is open circuited during AZ* phase. Reference voltage $V_R$ 15 is coupled to the positive input terminal of amplifier 21.

The circuit of FIG. 1A switches according to control signals AZ and AZ*. These signals represent alternating, non-overlapping timing signals. During the phase when AZ is high (AZ phase), signal $V_{zero}$ 11 is provided to capacitor C1 which is in turn coupled to the negative input of operational amplifier 21. The output of operational amplifier 21 is coupled to the negative input through switch 17 to provide feedback. Because the input offset of the amplifier is stored during this interval, the amplifier is auto zeroed.

During the phase when AZ* is high (AZ* phase), the direct feedback is cut off and capacitor C2, which had been charged up to the value of the output reference signal 19 plus the amplifier's input offset during the AZ phase, is now connected in a feedback loop. Output voltage $V_A$ at node 20 receives the stored output reference voltage from the capacitor C2. Signal $V_{IN}$ 10 is provided to capacitor C1, thus causing a potential change at the negative input of the amplifier corresponding to the difference between signal $V_{zero}$ and $V_{IN}$. The potential change at the negative input of the amplifier also causes a potential change at the output of the amplifier at node 20 to keep the voltage across capacitor C2 unchanged. Assuming an ideal operational amplifier and employing node analysis at node 14, the potential at output voltage $V_A$ is given as:

$$V_A = (V_{Zero} - V_{IN})\frac{C1}{C2} + V_{OUTREF} \text{ AZ* phase}$$

where $V_- =$ voltage at the negative input of the amplifier.

The valid output for this circuit is available only during the phase when AZ* is high. When AZ is high, the amplifier is auto-zeroed, and the output is equal to the input offset of the amplifier.

This circuit achieves low input offset by storing its offset on capacitor C1 and C2 during AZ phase. If it is desired to generate an output on both phases, a sample and hold circuit must be added such as the one illustrated in FIG. 1B. The circuit of FIG. 1B is a unity gain sample and hold structure. In FIG. 1B, voltage signal $V_A$ at node 20 is coupled to switch 22 during AZ* phase. Switch 22 is also coupled to capacitor C3 at node 23 where output voltage $V_{OUT}$ is taken from. Capacitor C3 is coupled to the negative input of operational amplifier 26 at node 25. Node 25 is coupled to the output of operational amplifier 26 through switch 27 which is closed during AZ* phase and open during AZ phase. During AZ phase, switch 22 is coupled to the output of operational amplifier 26 at node 28. Reference voltage $V_R$ 15 is coupled to the positive input terminal of operational amplifier 26.

During AZ* phase, switch 22 directly couples valid output voltage $V_A$ to $V_{OUT}$ at node 23. During this phase, amplifier 26 is auto-zeroed with switch 27 providing direct negative feedback to the negative input terminal of amplifier 26. Also, capacitor C3 is sampling the voltage $V_A$. During AZ phase, switch 22 is switched from voltage $V_A$ at node 20 to the output voltage of amplifier 26 at node 28. Also, switch 27 is open circuited so that amplifier 26 no longer has direct feedback. Because of the design of the sample and hold circuit of FIG. 1B, the voltage levels at nodes 23 and 25 across capacitor C3 are held to the same values at the beginning of the AZ phase that they are in the AZ* phase. Therefore, output voltage $V_{OUT}$ at node 23 is still equal to voltage $V_A$ during phase AZ. Each auto-zeroed circuit of FIGS. 1A and 1B has an output that is independent of the operational amplifiers offset. The output offset is not zero, however, due to charge injection from the switches.

Although the combined circuit of FIGS. 1A and 1B illustrate a circuit with an input that is auto-zeroed and an output that is valid on both phases, the circuit has several disadvantages. One drawback is that the prior art circuit requires two separate amplifiers, consuming a larger die area. Another drawback of the prior art circuit is that the circuit exhibits a larger input equivalent offset due to the offset being the sum of two circuit offsets. Furthermore, a glitch appears on the output at the beginning of each clock phase as the amplifier slews from its auto-zeroed voltage to its output voltage.

It is desired to have a circuit that combines both the auto-zeroing and the sample and hold functions. It is also desired to have a circuit that has better immunity to charge injection from the switches. It is further desired to reduce the input offset.

SUMMARY

The switched capacitor amplifier circuit of the present invention employs a single amplifier with a built-in sample and hold and input auto zero. The built-in sample and hold of the present invention provides a continuously valid output in a multi-phase system. The present invention comprises a new auto zero configuration and a new amplifier. The new amplifier is referred to as the AZAMP. The circuit configuration of the AZAMP of the present invention comprises a two stage amplifier with switches added to the circuitry to provide the sample and hold function. By disconnecting the second stage during the hold mode, the output voltage remains unchanged due to the voltage stored on a capacitor within the AZAMP. Charge cancelling circuitry is coupled to the sample and hold circuitry to cancel the charge injected onto said capacitor when the switch is turned off. The AZAMP of the present invention also has a self-contained auto zero function. The resulting benefits are reduced area consumption and low input equivalent offset.

DETAILED DESCRIPTION OF THE PRESENT INVENTION

An amplifier with a self contained auto zeroing and a sample and hold function is described. In the following description, numerous specific details, such as power supply values, bias voltages, etc. are described in detail in order to provide a more through description of the present invention. It will be apparent, however, to one skilled in the art, that the present invention may be practiced without these specific details. In other instances, well known features have not been described in detail in order not to unnecessarily obscure the present invention.

In the present invention, a switched-capacitor, differential amplifier configuration operating in a multi-phase process uses a single amplifier that provides both an auto zeroing function and a sample and hold function that allows for valid outputs during all phases of operation. The resulting benefits are reduced area consumption and low input equivalent offset.

Figure 1A:
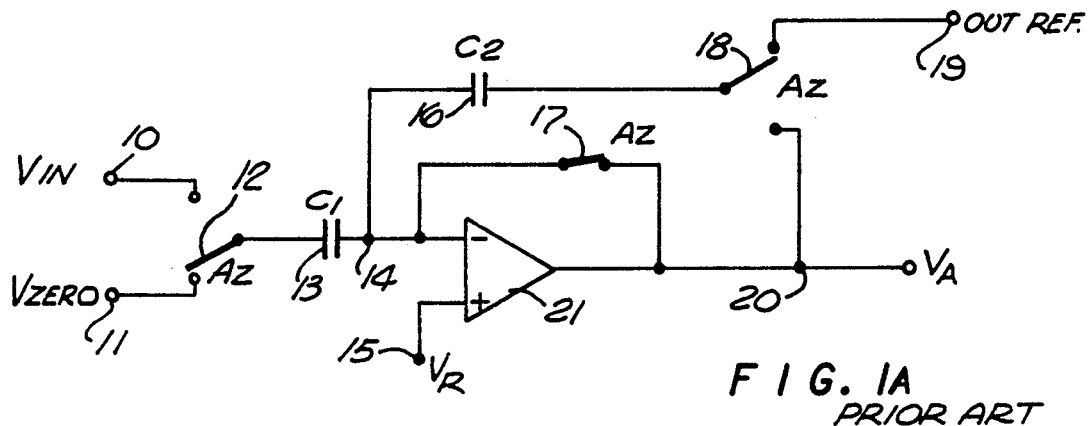
FIGS. 1A and 1B illustrate a prior art method for an auto-zeroed amplifier whose output is continuously valid.
Figure 1B:
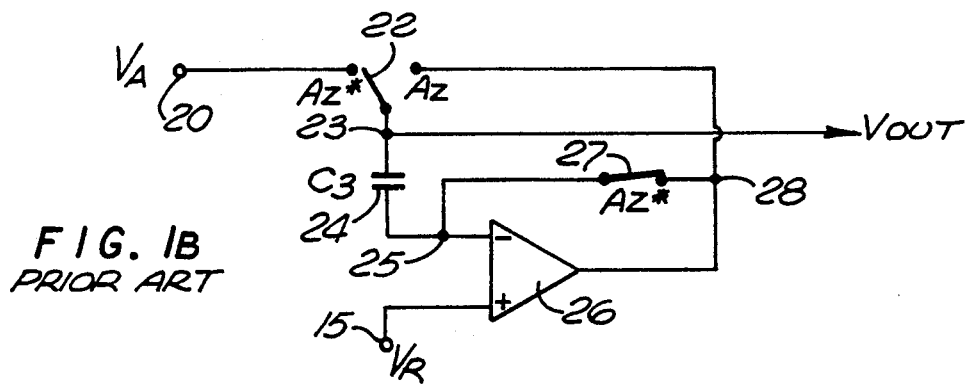
Figure 2:
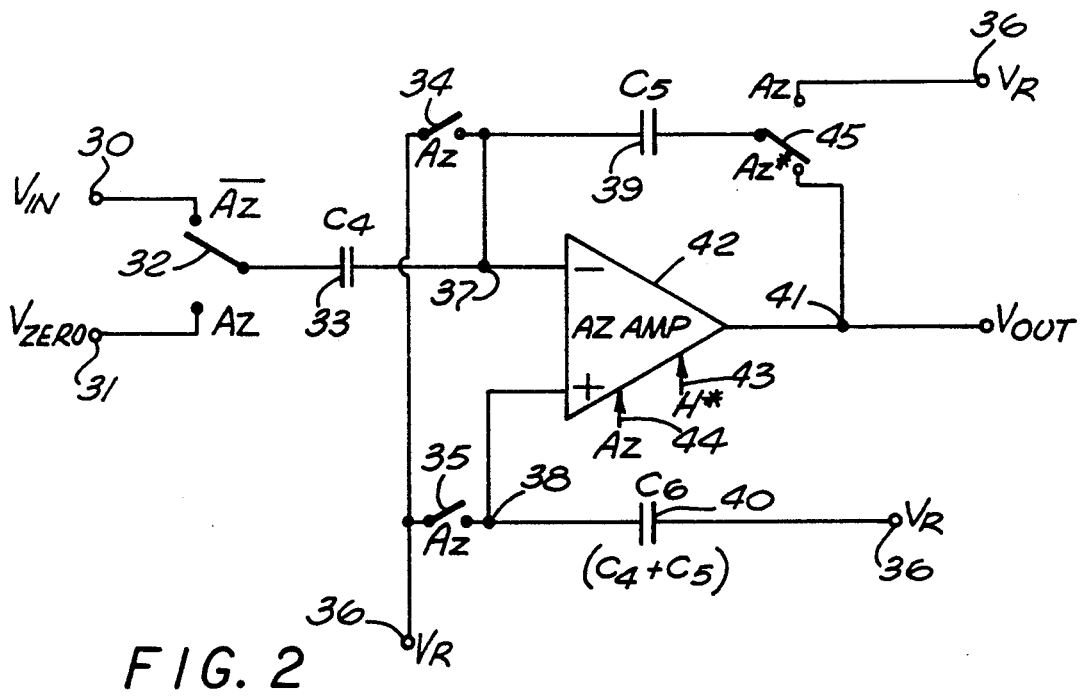
FIG. 2 illustrates one possible auto-zero configuration of the present invention.

The switched-capacitor, differential amplifier circuit using the AZAMP amplifier of the present invention is illustrated in FIG. 2. In FIG. 2, one terminal of switch 32 is coupled to input signal $V_{IN}$ 30 during AZ* phase and is coupled to signal $V_{zero}$ 31 during AZ phase. The other terminal of switch 32 is coupled to capacitor C4. Capacitor C4 is also coupled to the negative input terminal of AZAMP 42 at node 37. Switch 34 and capacitor C5 are also coupled to node 37. Switch 34 is closed during AZ phase and open during AZ* phase. Reference voltage $V_R$ 36 is coupled to switches 34 and 35. During AZ phase, switch 35 is closed and coupled to the positive input terminal of AZAMP 42 at node 38. During AZ* phase, capacitor C5 is coupled to the output of AZAMP 42 at node 41 through switch 45. During AZ phase, capacitor C5 is coupled to reference voltage OUTREF 39 through switch 45. Signals AZ 44 and H* 43 are coupled to the internal circuitry of AZAMP 42. Node 38 is also coupled to reference voltage OUTREF 39 through capacitor C6.

Concerning the operation of the circuit of FIG. 2, during AZ phase, all capacitors are initialized. In this phase, both inputs of AZAMP 42 are connected to reference voltage $V_R$ 36. $V_R$ is a DC voltage approximately 2.5 volts (near the middle of the power supply range). Also during AZ phase, AZAMP 42 stores its input offset on an internal capacitor. In this way, the amplifier nulls its offset and is auto-zeroed.

During AZ* phase, the bottom plate of capacitor C4 is connected to input voltage $V_{IN}$ 30, and the bottom plate of capacitor C5 is connected to $V_{OUT}$ at node 41. The AZ* phase causes a voltage at $V_{OUT}$ in FIG. 2.

$$V_{OUT} = (V_{zero} - V_{IN})\frac{C4}{C5} + OUTREF$$

Sometime during the AZ* phase, (the second half, for instance) hold signal 43 H* is raised to enable the output voltage $V_{OUT}$ of AZAMP 42 to step to the new value given by the above equation. When hold signal 43 H* is low, the output holds the previous value of $V_{OUT}$ generated during the previous AZ* phase. Hold signal H* 43 controls a switch inside AZAMP 42 and is described in detail in FIG. 3.

When AZ switches 34 and 35 turn off, some charge will be injected onto node 36. If equal amounts are injected by each switch, the offset will be cancelled when the value of C6 is C4+C5.

A variation of the two-phase timing scheme of FIG. 2 is to use a three phase scheme where the AZ signal 44 inputted into AZAMP 42 is turned on after AZ clock signal goes low and before AZ* clock signal goes high. This alternate timing scheme consists of three alternate, non-overlapping clock signals. By inserting another phase into the timing scheme, this allows the AZAMP to compensate for offset caused by mismatch of the charge injection from AZ switches 34 and 35.

A second independent variation of the timing scheme is to adjust the timing of signal H*. The circuit of FIG. 2 will also work properly if signal H* 43 follows the same timing pattern as signal AZ*. The transient settling time at voltage $V_{OUT}$ is less, however, if H* is turned on after AZ* turns on.

Figure 3:
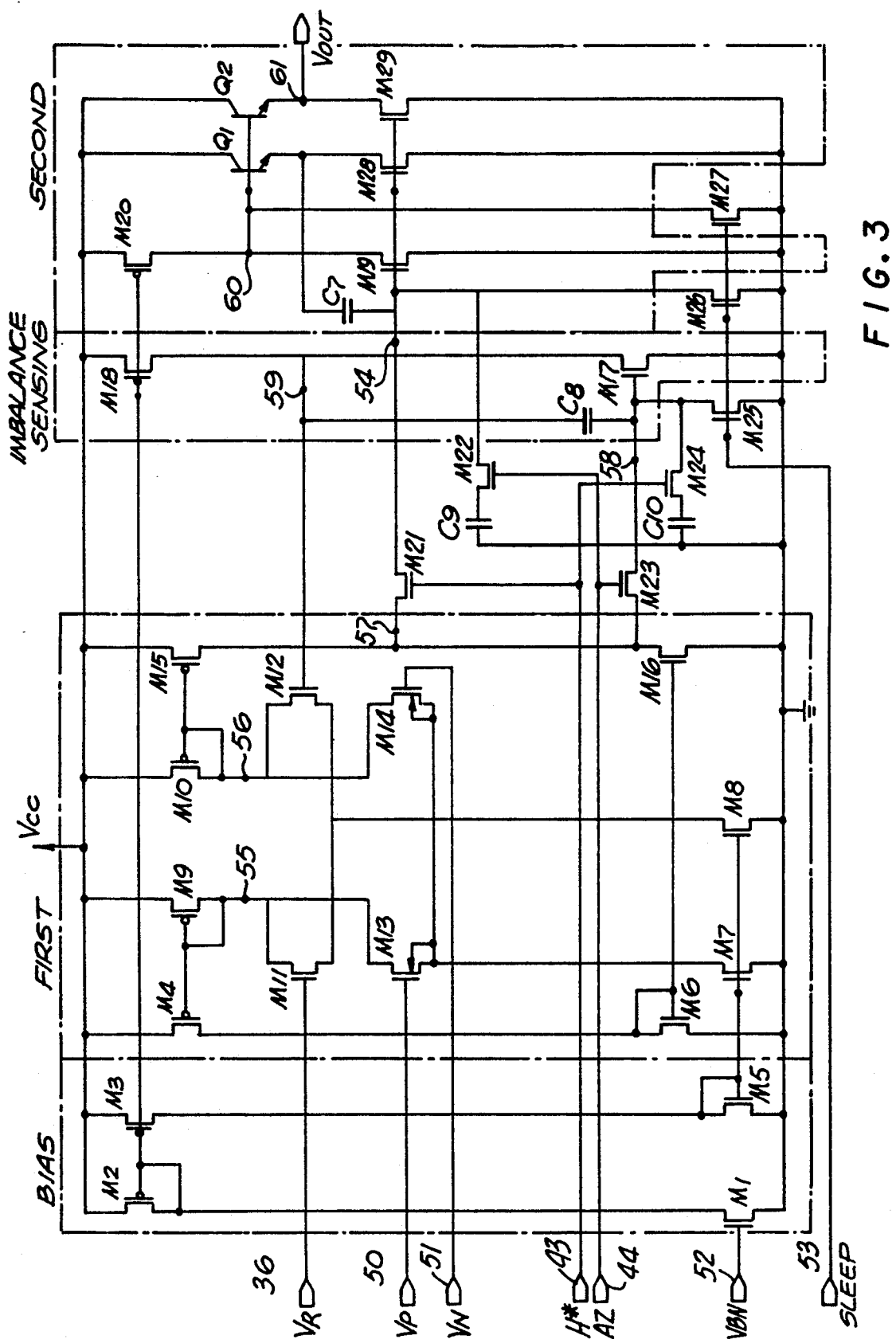
FIG. 3 illustrates the preferred embodiment of the present invention.

The circuit of the AZAMP 42 shown in FIG. 2 is illustrated in FIG. 3. In FIG. 3, reference voltage signal 36 is inputted to the gate of NMOS transistor M11. Signal VP 50, the voltage signal coupled to the positive input node of the AZAMP, is coupled to the gate of NMOS transistor M13. Signal VN 51, the voltage input signal to the negative input terminal of the AZAMP, is coupled to the gate of NMOS transistor M14. Signal H* 43 is coupled to the gates of NMOS transistors M21 and M24. AZ signal 44 is coupled to the gates of transistors M22 and M23. Signal VBN 52 is coupled to the gate of NMOS transistor M1. Sleep signal 53 is coupled to the gates of NMOS transistors M25, M26 and M27.

The drain of NMOS transistor M1 is coupled to the drain of PMOS transistor M2. The drain of transistor M2 is coupled to its own gate as well as being coupled to the gate of PMOS transistor M3. The source of transistor M2 is coupled to power supply $V_{CC}$. The source of transistor M1 is coupled to ground. The drain of PMOS transistor M3 is coupled to the drain of NMOS transistor M5 and also coupled to the gate of transistor M5. The gate of transistor M5 is also coupled to the gates of NMOS transistors M7 and M8. The sources of transistors M5, M7 and M8 are coupled to ground.

The gate of PMOS transistor M3 is coupled to the gates of PMOS transistors M18 and M20. The sources of transistors M3, M18 and M20 are coupled to power supply $V_{CC}$. The drain of transistor M18 is coupled to the drain of NMOS transistor M17 as well as coupled to the gate of NMOS transistor M12 at node 59. The bottom plate of capacitor C8 is also coupled to node 59. The top plate of capacitor C8 is coupled to the gate of transistor M17 as well as coupled to the source of NMOS transistor M23 at node 58. The drain of NMOS transistor M24 and the drain of NMOS transistor M25 are also coupled to node 58. The sources of transistors M25, M17, M26 and M27 are coupled to ground.

The source of transistor M24 is coupled to the top plate of capacitor C10. The bottom plate of capacitor C10 is coupled to ground. The drain of transistor M23 is coupled to the drain of NMOS transistor M16 at node 57. The drain of NMOS transistor M21 as well as the drain of PMOS transistor M15 are also coupled to node 57. The source of transistor M21 is coupled to the gates of NMOS transistors M19, M28 and M29 at node 54. The top plate of capacitor C7 and the drain of NMOS transistor M22 are also coupled to node 54. The drain of NMOS transistor M26 is coupled to node 54. The source of transistor M22 is coupled to the top plate of capacitor C9, and the bottom plate of capacitor C9 is coupled to ground. The bottom plate of capacitor C7 is coupled to the emitter of bipolar junction transistor Q1 as well as coupled to the drain of NMOS transistor M28. The base of transistor Q1 is coupled to the base of bipolar junction transistor Q2 and the drain of NMOS transistor M27 at node 60. The drain of transistor M20 and the drain of transistor M19 are also coupled to node 60. The collectors of transistors Q1 and Q2 are coupled to the power supply of $V_{CC}$.

The sources of transistors M19, M28 and M29 are coupled to ground. The emitter of transistor Q2 is coupled to the drain of transistor M29 at node 61 which provides the output voltage. The gate of PMOS transistor M15 is coupled to the gate and drain of PMOS transistor M10 at node 56. The drains of NMOS transistors M12 and M14 are also coupled to node 56. The source of transistor M12 is coupled to the source of transistor M11 as well as coupled to the drain of NMOS transistor M8. The source of transistor M14 is coupled to the source of transistor M13 as well as coupled to the drain of transistor M7. The drain of transistor M13 is coupled to the drain of transistor M11 as well as the drain of PMOS transistor M9 at node 55. The gate of transistor M9 as well as the gate of PMOS transistor M4 are also coupled to node 55. The sources of transistors M4, M9, M10 and M15 are coupled to power supply $V_{CC}$. The drain of transistor M4 is coupled to the drain and gate of NMOS transistor M6 as well as coupled to the gate of transistor M16. The source of transistor M6 and the source of transistor M16 are coupled to ground.

Signals VP 50 and VN 51 represent the differential input signals to the AZAMP. Signal VR 36 is a reference DC voltage (2.25 volts in this case). Signal VBN 52 is a DC voltage to set the current in transistor M1 at approximately 20 micro-amps. Sleep signal 53 is an optional input signal which when high, disables the amplifier and reduces its supply current. During normal operation, the sleep signal is grounded.

FIG. 3 can be viewed as being divided into separate blocks with transistors M1-M3 and M5 labeled as the bias stage. Transistors M4 and M6-M16 comprise the first stage. Transistors M17 and M18 and capacitor C8 comprise the imbalance sensing stage. Transistor M19, M20, M28, M29, Q1 and Q2 and capacitor C7 comprise the second stage. The design of the stages of the AZAMP shown in FIG. 3 is only an example. The stages are not limited to this design exclusively.

When signal AZ 44 is low (deactivated) and signal H* 43 is high, the AZAMP comprises a two stage amplifier with a push-pull input stage as shown in FIG. 3. When signal AZ is high and signal H* is low, the AZAMP also comprises a third stage (imbalance sensing stage) for providing the auto-zero function. Signals AZ 44 and H* 43 should be non-overlapping for proper operation of the AZAMP. Switches are added to this configuration to provide the sample and hold function. The purpose is to disconnect the second stage at node 54 during the hold mode (H* low). By disconnecting the second stage during the hold mode, the output voltage of AZAMP remains unchanged due to the voltage stored on capacitor C7 (accumulated during the sample mode, H* high).

In this example, hold mode occurs when H* is low and sample mode occurs when H* is high. The circuitry in FIG. 3 that implements the switch is transistor M21. The turn on and turn off of transistor switch M21 is controlled by signal H* 43. When signal H* is high, switch M21 is closed and when signal H* is low, switch M21 is open. In addition, transistor M22 and capacitor C9 cancel the charge injected into capacitor C7 when transistor M21 turns off. (Note that other charge cancelling switch designs can be implemented.)

The auto zero function is added to this circuit by employing an imbalance sensing stage for sensing any imbalance that exists in the first stage. Furthermore, a small differential current is introduced at nodes 55 and 56. During auto zeroing, signals VP 50 and VN 51 are both tied to zero references. In this state, offset occurs if an imbalance exists in the first stage. This imbalance is sensed with the imbalance sensing stage.

During auto zero (AZ signal 44 high) the imbalance sensing stage is connected to the first stage output at node 57. If the first stage is balanced, the output of the imbalance sensing stage at node 59 is near the center of the power supply. Imbalance in the first stage is adjusted by connecting node 59 of the imbalance sensing stage to one side of the differential pair of the first stage. Since the other side of the differential pair is connected to a bias voltage position near the center of the supply, the differential pair introduces a current at nodes 55 and 56 to counter the imbalance.

When AZ signal 44 turns off, node 57 is disconnected from node 58 and the correction voltage is stored on capacitor C8. The switch that disconnects nodes 57 and 58 is transistor M23. The turn on and turn off of transistor switch M23 is controlled by signal AZ 44. When AZ is high, auto-zeroing switch M23 is closed and switch M22 of the charge cancelling circuit for sample and hold switch M21 is also closed. AZ 44 controls the charge cancelling circuitry for sample and hold switch M21 since when AZ 44 is high, sample and hold switch M21 is open and transistor M22 is turned on to cancel the charge from sample and hold capacitor C7. Similar reasoning is true for why H* 43 controls charge cancelling transistor M24 for auto-zeroing switch M23. When H* 43 is high, AZ 44 is low, thereby opening auto-zeroing switch M23. Charge cancellation for transistor M23 is provided by transistor M24 and capacitor C10.

The charge injected into correction voltage capacitor C8 by the switch transistor M23 results in an offset error. This error is amplified by the transconductance ratio of transistors M11 and M12 to transistors M13 and M14. This ratio is typically in the range of ⅛–1/10. The actual voltage chosen for signal VR 36 can be developed in several ways. For the actual AZAMP application, a simple band gap reference is used. Improved performance can be obtained by establishing signal VR 36 at the same voltage as node 60 when the output is at ground. Further improvements can be made by compensating this voltage for base current drawn by transistors Q1 and Q2.

In sleep mode the AZAMP is to be powered down. Circuity elsewhere pulls signal VBN 52 to ground to turn off most bias currents. Additional pull down transistors M25, M26 and M27 pull down the remaining floating nodes.

Figure 4:
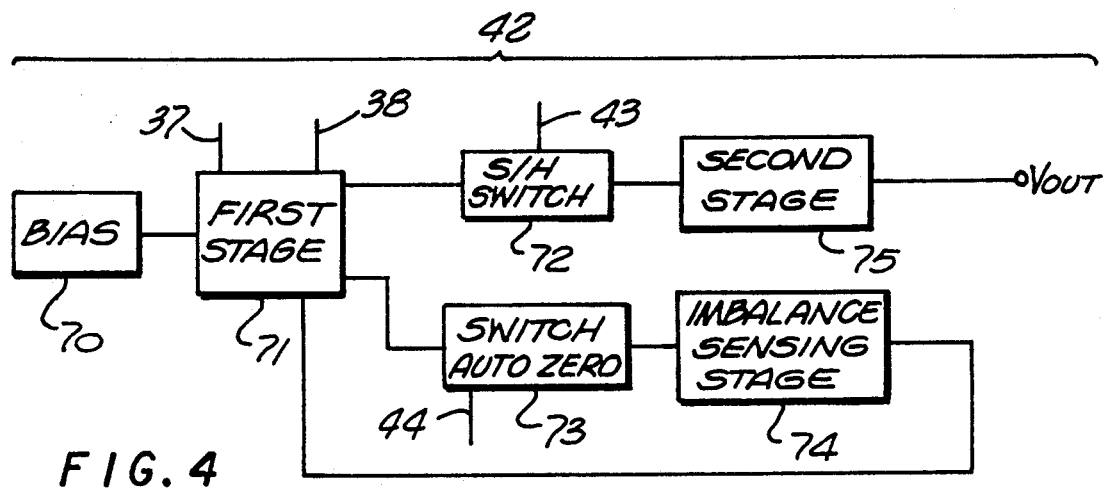
FIG. 4 illustrates a block diagram of the preferred embodiment of the present invention.

A block diagram of the amplifier AZAMP of the present invention is described in FIG. 4. In FIG. 4, bias stage 70 is coupled to first stage 71. First stage 71 is coupled to sample and hold switch 72 and auto zeroing switch 73. The auto zeroing switch 73 is coupled to imbalance sensing stage 74, while sample and hold switch 72 is coupled to second stage 75. Imbalance sensing stage 74 is coupled back to first stage 71. Second stage 75 provides the output voltage of the amplifier. The imbalance sensing stage adjusts the offset of the first stage. FIG. 4 gives a simple overview of the functional blocks within the amplifier of the present invention. FIG. 4 shows that the auto zeroing of the input offset occurs within the amplifier while the sample and hold switch inside the amplifier allows for valid outputs during all phases of operation. The offset is stored in a capacitor within the imbalance sensing stage 74. Charge cancelling circuitry for the sample and hold switch and auto-zeroing switch can also be added to FIG. 4.

Figure 5A:
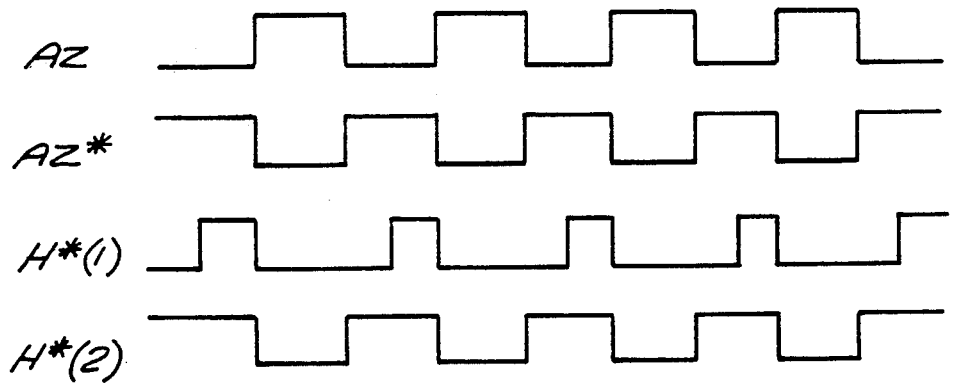
FIGS. 5A and 5B are timing diagrams that illustrate the preferred and alternate timing schemes for controlling the auto-zero configuration of the present invention.
Figure 5B:
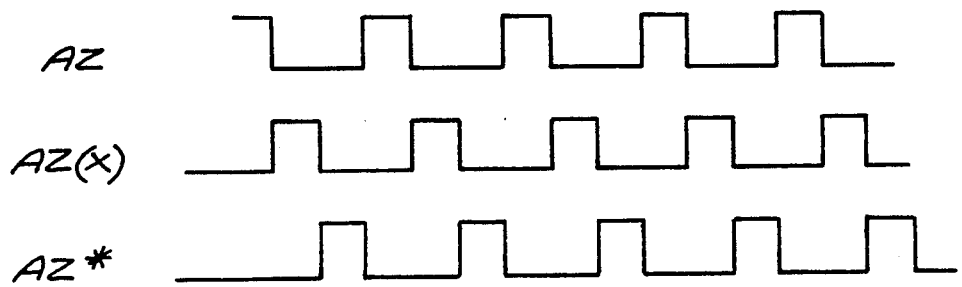

FIGS. 5A and 5B are timing diagrams that illustrate the preferred and alternate timing schemes for controlling the auto-zero configuration and AZAMP of the present invention. In FIG. 5A, it can be seen that signals AZ and AZ* are non-overlapping clock signals. As previously stated, these signals control the switching means employed in the auto-zero configuration circuit coupled to the AZAMP. FIG. 5A also shows two different timing schemes for hold signal H* 43. The second version of hold signal H* follows the AZ* clocking signal and the circuit will work properly if this timing scheme is provided. However, the first version of the hold signal is the preferred timing scheme since the transient settling time at the output of the AZAMP is less if the hold signal H* is turned on after AZ* turns on. By referring to FIG. 3, hold signal H* controls the turn on and turn off of transistor switch M21 which is used for sampling the output of the first stage of FIG. 3 and this output is then held by capacitor C7 on node 54. For the circuit of FIG. 3 to work properly, clocking signal AZ* should be high whenever signal H* is high.

FIG. 5B shows an alternate 3-phase timing scheme in contrast to the 2-phase timing scheme discussed for the present invention. FIG. 5B shows three alternate, non-overlapping clock signals where signal AZ 44 which is inputted to AZAMP 42 is turned on after AZ clocking signal is turned off and before AZ* clocking signal is turned on. This alternate timing scheme allows the AZAMP to compensate for offset caused by mismatch and charge injection from the switches controlled by the AZ clocking signal. In the previous example discussed, AZ signal 44 follows the same timing scheme as the AZ non-overlapping clock signal.

Thus, an operational amplifier with self-contained sample and hold and auto zero has been described.

I claim:

1. A differential amplifier comprising:
   a first stage for receiving a differential input signal;
   a first biasing means coupled to said first stage;
   a first switching means coupled to an output of said first stage and an imbalance sensing stage.
   a first charge cancelling means coupled to said first switching means;
   said imbalance sensing stage coupled to said first switching means for sensing and correcting offset in said first stage and storing a correction voltage suitable for maintaining offset correction when said first switching means is turned off;
   a second switching means coupled to said first stage and to a second stage;
   a second charge cancelling means coupled to said second switching means;
   said second stage providing a valid output from said differential amplifier during each phase of a plurality of phases of operation.

2. The differential amplifier of claim 1 wherein said first charge cancelling means comprises a first MOS transistor coupled to a first capacitor.

3. The differential amplifier of claim 1 wherein said second charge cancelling means comprises a second MOS transistor coupled with a second capacitor.

4. The differential amplifier of claim 3 wherein said correction voltage provided by said imbalance sensing stage is stored in a third capacitor.

5. The differential amplifier of claim 4 wherein said second switching means is controlled by a holding signal, said second switching means disconnects said first stage from said second stage and said second stage stores said output from said first stage on a voltage stored on a fourth capacitor when said holding signal is high.

6. A differential amplifier circuit comprising:
   a first stage for receiving a differential input signal;
   a first switching means coupled to the output of said first stage and an analog imbalance sensing stage;
   said imbalance sensing stage coupled to said first switching means for sensing and correcting offset in said first stage and storing onto a first capacitor a correction voltage suitable for maintaining offset correction when said first switching means is turned off;

a first charge cancelling means coupled to said first switching means comprising a first MOS transistor coupled with a second capacitor;

a second switching means coupled to said first stage and to a second stage;

said second stage providing a valid output from said differential amplifier during each phase of a plurality of phases of operation.

7. The differential amplifier circuit of claim 6 wherein a second charge cancelling means comprising a second MOS transistor coupled with a third capacitor is coupled to said second switching means.

8. An auto-zero configuration circuit comprising:

a first switching means coupled to a user input voltage and an input reference voltage;

a first capacitor coupled to said first switching means;

a differential amplifier coupled to said first capacitor;

a second and third switching means coupled to negative and positive inputs respectively of said differential amplifier, said second and third switching means also coupled to a first reference voltage, said negative input also coupled to said first capacitor;

a second and third capacitor coupled to said negative and positive inputs, respectively of said differential amplifier;

a fourth switching means coupled to said second capacitor and also coupled to an output of said differential amplifier and a second reference voltage; and wherein said first, second, third and fourth switching means are controlled by first and second non-overlapping clock signals wherein during said first non-overlapping clock signal, said first switching means couples said input reference voltage to said first capacitor, said second and third switching means couple said first reference voltage to said negative and positive inputs respectively, and said fourth switching means couples said second reference voltage to said second capacitor.

9. The auto-zero configuration of claim 8 wherein said first reference voltage is approximately one-half of a power supply.

10. The auto-zero configuration of claim 8 wherein said differential amplifier comprises;

a first stage;

a first biasing means coupled to said first stage;

a fifth switching means coupled to an output of said first stage and an imbalance sensing stage;

a first charge cancelling means coupled to said fifth switching means;

said imbalance sensing stage sensing and correcting offset in said first stage and storing a correction voltage suitable for maintaining offset correction when said fifth switching means is turned off;

a sixth switching means coupled to said first stage and to a second stage;

a second charge cancelling means coupled to said sixth switching means;

said second stage providing a valid output from said differential amplifier during each phase of a plurality of phases of operation.

11. The auto-zero configuration circuit of claim 10 wherein a hold signal controls said sixth switching means, said hold signal is deasserted during the second half of when said second non-overlapping clock signal is high.

12. The auto-zero configuration circuit of claim 10 wherein a holding signal controls said sixth switching means, said holding signal deasserted while said second non-overlapping clock signal is high.

13. The auto-zero configuration circuit of claim 10 wherein a first control signal controls said switching of said fifth switching means, said first control signal asserted whenever said first non-overlapping clock signal is high.

14. The auto-zero configuration circuit of claim 10 wherein a second control signal controls said switching of said fifth switching means, said second control signal being non-overlapping of said first and second non-overlapping clock signals wherein said second control signal is asserted after said first non-overlapping clock signal is high and before said second non-overlapping clock signal is high.

15. An auto-zero configuration circuit comprising:

a first switching means coupled to a user input voltage;

a first capacitor coupled to said first switching means;

said first capacitor coupled to a differential amplifier comprising:

a first stage for receiving a differential input signal;

a first biasing means coupled to said first stage;

a second switching means coupled to an output of said first stage and an imbalance sensing stage;

a first charge cancelling means coupled to said second switching means;

said imbalance sensing stage coupled to said second switching means for sensing and correcting offset in said first stage and storing a correction voltage suitable for maintaining offset correction when said second switching means turns off;

a third switching means coupled to said first stage and to a second stage;

a second charge cancelling means coupled to said third switching means;

said second stage providing a valid output from said differential amplifier during each phase of a plurality of phases of operation;

a fourth and fifth switching means coupled to negative and positive inputs, respectively, of said differential amplifier, said fourth and fifth switching means also coupled to a first reference voltage;

a second and third capacitor coupled to said negative and positive inputs, respectively, of said differential amplifier;

a sixth switching means coupled to said output of said differential amplifier, said second capacitor and a second reference voltage.

16. The auto-zero configuration circuit of claim 15 wherein said first, fourth, fifth and sixth switching means are controlled by first and second non-overlapping clock signals wherein during said first non-overlapping clock signal, said first switching means passes an input reference voltage to said first capacitor, said fourth and fifth switching means pass said first reference voltage to said negative and positive inputs respectively, and said sixth switching means passes said second reference voltage to said second capacitor.

17. The auto-zero configuration circuit of claim 16 wherein said first reference voltage is approximately one-half of a power supply.

18. The auto-zero configuration circuit of claim 17 wherein a hold signal controls said third switching means, said hold signal is deasserted during the second half of when said second non-overlapping clock signal is high.

19. The auto-zero configuration circuit of claim 17 wherein a holding signal controls said third switching means, said holding signal is deasserted during the time said second non-overlapping clock signal is high.

20. The auto-zero configuration circuit of claim 17 wherein a first control signal controls said switching of said second switching means, said first control signal asserted whenever said first non-overlapping clock signal is high.

21. The auto-zero configuration circuit of claim 17 wherein a second control signal controls said switching of said second switching means, said second control signal being non-overlapping of said first and second non-overlapping clock signals wherein said second control signal is high after said first non-overlapping clock signal is high and before said second non-overlapping clock signal is high.

22. A differential amplifier comprising:
a first source coupled pair comprising first and second transistors and receiving a differential input signal;
the drain of said first transistor coupled to the drain of a third transistor, the drain and gate of a fourth transistor, and the gate of an eighth transistor;
the drain of said second transistor coupled to the drain of a fifth transistor, the drain and gate of a sixth transistor; and the gate of a ninth transistor;
said sources of said first source coupled pair coupled to the drain of a seventh transistor;
said third and fifth transistors forming a second source coupled pair, said sources of said second source coupled pair coupled to the drain of a tenth transistor;
the drain of said eighth transistor coupled to the drain and gate of an eleventh transistor and gate of a twelfth transistor;
the drain of said ninth transistor coupled to the drains of a thirteenth, fourteenth and said twelfth transistors;
the sources of said fourth, sixth, eighth and ninth transistor coupled to a power supply;
the gate of said third transistor coupled to a reference voltage;
the gates of said seventh and tenth transistors coupled to the gate and drain of a fifteenth transistor and drain of a sixteenth transistor;
the gates of said sixteenth transistor and a seventeenth, nineteenth and twentieth transistor coupled to the drains of said seventeenth transistor and an eighteenth transistor;
the sources of said sixteenth and seventeenth transistors coupled to said power supply;
the sources of said seventh, tenth, eleventh, twelfth, fifteenth and eighteenth transistors coupled to ground;
a bias voltage coupled to the gate of said eighteenth transistor;
a first control signal coupled to the gates of said thirteenth transistor and a twenty-first transistor;
a second control signal coupled to the gates of said fourteenth transistor and a twenty-second transistor;
the gate of said fifth transistor coupled to a first plate of a first capacitor, and the drains of said nineteenth transistor and a twenty-third transistor;
the source of said thirteenth transistor coupled to a first plate of a second capacitor, gates of a twenty-fourth, twenty-fifth and twenty-sixth transistor, and the drains of said twenty-second and a twenty-eighth transistor;
the source of said fourteenth transistor coupled to a second plate of said first capacitor, the gate of said twenty-third transistor, the drain of said twenty-first transistor, and the drain of a twenty-seventh transistor;
the source of said twenty-second transistor coupled to a first plate of a third capacitor;
the source of said twenty-first transistor coupled to a first plate of a fourth capacitor;
a second plate of said third and fourth capacitors coupled to ground;
the drain of said twentieth transistor coupled to the drains of said twenty-fourth transistor and a twenty-ninth transistor and to the bases of a thirtieth and thirty-first transistors;
the emitter of said thirtieth transistor coupled to a second plate of said second capacitor and the drain of said twenty-fifth transistor;
the emitter of said thirty-first transistor providing an output voltage coupled to the drain of said twenty-sixth transistor;
the sources of said nineteenth and twentieth transistors and the collectors of said thirtieth and thirty-first transistors coupled to said power supply;
the sources of said twenty-seventh, twenty-third, twenty-eight, twenty-fourth, twenty-fifth, twenty-sixth, and twenty-ninth transistors coupled to ground;
the gates of said twenty seventh, twenty eighth and twenty ninth transistors coupled to a third control signal.

23. A differential amplifier comprising:
a first source coupled pair comprising first and second transistors and receiving a differential input signal;
the drain of said first transistor coupled to the drain of a third transistor, the drain and gate of a fourth transistor, and the gate of an eighth transistor;
the drain of said second transistor coupled to the drain of a fifth transistor, the drain and gate of a sixth transistor; and the gate of a ninth transistor;
said sources of said first source coupled pair coupled to the drain of a seventh transistor;
said third and fifth transistors forming a second source coupled pair, said sources of said second source coupled pair coupled to the drain of a tenth transistor;
the drain of said eighth transistor coupled to the drain and gate of an eleventh transistor and gate of a twelfth transistor;
the drain of said ninth transistor coupled to a first terminal of a first and second switching means and the drain of said twelfth transistors;
the sources of said fourth, sixth, eighth and ninth transistor coupled to a power supply;
the gate of said third transistor coupled to a reference voltage;
the gates of said seventh and tenth transistors coupled to the gate and drain of a fifteenth transistor and drain of a sixteenth transistor;
the gates of said sixteenth transistor and a seventeenth, nineteenth and twentieth transistor coupled to the drains of said seventeenth transistor and an eighteenth transistor;
the sources of said sixteenth and seventeenth transistors coupled to said power supply;

the sources of said seventh, tenth, eleventh, twelfth, fifteenth and eighteenth transistors coupled to ground;

a bias voltage coupled to the gate of said eighteenth transistor;

a first control signal coupled to a second terminal of said second switching means;

a second control signal coupled to a second terminal of said first switching means;

the gate of said fifth transistor coupled to a first plate of a first capacitor, and the drains of said nineteenth transistor and a twenty-third transistor;

a third terminal of said second switching means coupled to a first plate of a second capacitor, gates of a twenty-fourth, twenty-fifth and twenty-sixth transistor, and the drain of a twenty-eighth transistor;

a third terminal of said first switching means coupled to a second plate of said first capacitor, the gate of said twenty-third transistor and to the drain of a twenty-seventh transistor;

the drain of said twentieth transistor coupled to the drains of said twenty-fourth transistor and a twenty-ninth transistor and to the bases of a thirtieth and thirty-first transistors;

the emitter of said thirtieth transistor coupled to a second plate of said second capacitor and the drain of said twenty-fifth transistor;

the emitter of said thirty-first transistor providing an output voltage coupled to the drain of said twenty-sixth transistor;

the sources of said nineteenth and twentieth transistors and the collectors of said thirtieth and thirty-first transistors coupled to said power supply;

the sources of said twenty-seventh, twenty-third, twenty-eight, twenty-fourth, twenty-fifth, twenty-sixth, and twenty-ninth transistors coupled to ground;

the gates of said twenty seventh, twenty eighth, and twenty ninth transistors coupled to a third control signal.

24. The differential amplifier of claim 23 wherein said first switching means comprises a first n-channel FET transistor.

25. The differential amplifier of claim 23 wherein said second switching means comprises a second n-channel FET transistor.

26. The differential amplifier of claim 23 wherein said differential amplifier also includes a first charge cancelling means coupled to said first switching means comprising a third n-channel FET transistor coupled to a third capacitor.

27. The differential amplifier of claim 23 wherein said differential amplifier also comprises a second charge cancelling means coupled to said second switching means comprising a fourth n-channel FET transistor coupled to a fourth capacitor.

* * * * *